(12) United States Patent
Morimura et al.

(10) Patent No.: US 7,594,307 B2
(45) Date of Patent: Sep. 29, 2009

(54) METHOD FOR MANUFACTURING PIEZOELECTRIC RESONATOR

(75) Inventors: Tetsuya Morimura, Toyama (JP); Yoshihiro Ikeda, Himi (JP); Makoto Irie, Toyama (JP); Motonori Matsushita, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 363 days.

(21) Appl. No.: 11/188,981

(22) Filed: Jul. 25, 2005

(65) Prior Publication Data

US 2006/0048358 A1 Mar. 9, 2006

(30) Foreign Application Priority Data

Sep. 7, 2004 (JP) .............................. 2004-259389
Jun. 10, 2005 (JP) .............................. 2005-170368

(51) Int. Cl.
*H01L 41/22* (2006.01)
*H01L 41/00* (2006.01)

(52) U.S. Cl. .......................... 29/25.35; 29/831; 29/832; 29/835; 29/847; 310/324

(58) Field of Classification Search ................ 29/25.35, 29/830, 831, 832, 835, 847; 310/324, 311, 310/313 A, 346, 349; 333/187, 189, 191, 333/195

See application file for complete search history.

(56) References Cited

U.S. PATENT DOCUMENTS 4,870,313 A * 9/1989 Hirama et al. .............. 310/320
5,382,930 A * 1/1995 Stokes et al. ............... 333/191
5,982,254 A * 11/1999 Shimura .................... 333/189
6,014,799 A * 1/2000 Kaida ....................... 29/25.35
6,144,141 A * 11/2000 Unami et al. ............... 310/328
6,383,411 B1 * 5/2002 Sawada et al. .............. 252/503
6,414,569 B1 * 7/2002 Nakafuku .................. 333/188
6,556,103 B2 * 4/2003 Shibata et al. .............. 333/187
2004/0164367 A1 8/2004 Park

FOREIGN PATENT DOCUMENTS

| JP | 05-029864 |   | 2/1993 |
| JP | 06-016561 | * | 2/1994 |
| JP | 06-224677 |   | 8/1994 |
| JP | 10-143514 | * | 5/1998 |

OTHER PUBLICATIONS

Official communication issued in counterpart Chinese Application No. 200510092627.5, mailed on Apr. 25, 2008.

\* cited by examiner

*Primary Examiner*—Derris H Banks
*Assistant Examiner*—Tai Nguyen
(74) *Attorney, Agent, or Firm*—Keating & Bennett, LLP

(57) ABSTRACT

A method of manufacturing a piezoelectric resonator includes forming first electrodes larger than vibrating electrodes in an area D1 including the vibrating electrodes on obverse and reverse surfaces of a piezoelectric substrate, and measuring the resonant frequency $fr_1$ of a resonator including the first electrodes. The thickness of a metallic thin film required for frequency adjustment is determined based on the measured resonant frequency. Then, second electrodes formed of the metallic thin film having the determined thickness are formed in an area D2 including at least the vibrating electrodes of the piezoelectric substrate. By removing unnecessary portions of the first and second electrodes, a pattern of the resulting vibrating electrodes is formed. Thus, high-accuracy frequency adjustment can be achieved without the need for complicated positioning.

15 Claims, 13 Drawing Sheets

METHOD FOR MANUFACTURING PIEZOELECTRIC RESONATOR

BACKGROUND OF THE INVENTION

1. Field of the Invention

The present invention relates to a method for manufacturing a piezoelectric resonator in which vibrating electrodes are disposed on both surfaces of a piezoelectric substrate and piezoelectric vibration is trapped between the vibrating electrodes, and more particularly, the present invention relates to a method for adjusting the frequency of the piezoelectric resonator.

2. Description of the Related Art

In recent years, in the field of piezoelectric resonators used in, for example, oscillators or filters, there is an increasing demand for accurately adjusting the frequency. Previously, ink is applied onto an electrode, and the frequency is adjusted by a mass load of the electrode. In this method, however, variations in the application quantity of ink are large, and the concentration of the frequency is low, thereby failing to adjust the frequency accurately.

To solve this problem, Japanese Unexamined Patent Application Publication No. 5-29864 discloses a frequency adjusting method in which vibrating electrodes are formed on both surfaces of a piezoelectric substrate, and a metallic film, for example, a metallic thin film, having a predetermined thickness is formed on each vibration electrode by a dry process.

More specifically, vibrating electrodes having a desired final configuration are formed on a piezoelectric substrate. Then, etching resist ink is applied onto the overall surface of the piezoelectric substrate, except for the portion on which the vibrating electrodes are disposed, and a metallic material is attached onto the vibrating electrodes by vapor deposition or sputtering. Then, the etching resist ink is removed. Instead of using an etching resist ink, the overall piezoelectric substrate may be covered with a metallic mask, except for the portion on which the vibrating electrodes are formed, and a metallic material is attached onto the vibrating electrodes by vapor deposition or sputtering.

Japanese Unexamined Patent Application Publication No. 6-224677 discloses the following technique. A metallic film is formed on each surface of a piezoelectric substrate, and the resulting piezoelectric substrate is then polarized. The frequency is then measured, and a vapor deposited film is formed until a target frequency is reached and is then patterned into the configuration of an electrode.

In the method for forming a metallic film on the vibrating electrodes by a dry process, such as that in Japanese Unexamined Patent Application Publication No. 5-29864, the thickness of the film can be precisely controlled, and thus, the resonant frequency can be adjusted accurately in very small increment/decrement units of ±0.1%.

In this method, it is necessary to overlay a metallic film only on the vibrating electrodes. However, in either of the method for using etching resist ink or a metallic mask, it is difficult to accurately position the etching resist ink or the metallic mask to the vibrating electrodes, thereby making the frequency adjustment difficult. In particular, recently, as the size of piezoelectric resonators becomes smaller, the structure of vibrating electrodes becomes finer. In this case, a slight deviation of etching resist ink or a metallic mask seriously influences the adjustment precision.

FIGS. 13A and 13B illustrate the conditions in which a metallic thin film 61 is formed on a vibrating electrode 60 on a piezoelectric substrate 62 by a known method. More specifically, FIG. 13A illustrates the condition in which the metallic thin film 61 is accurately formed on the vibrating electrode 60, and FIG. 13B illustrates the condition in which there is a deviation 6 between the vibrating electrode 60 and the metallic thin film 61.

If the metallic thin film 61 is accurately formed on the vibrating electrode 60, as shown in FIG. 13A, the thickness of the resulting vibrating electrode is uniform. In contrast, if there is a deviation 6 of the metallic thin film 61 from the vibrating electrode 60, as shown in FIG. 13B, the resulting vibrating electrode has a thicker portion and a thinner portion, i.e., the thickness of the resulting vibrating electrode is not uniform, thereby making it difficult to adjust the frequency to be a target frequency.

The adjusting method disclosed in Japanese Unexamined Patent Application Publication No. 6-224677 presents the following problems since the first formation of a film for electrodes is performed on the overall surface of the piezoelectric substrate.

One problem is that trapping of piezoelectric vibration becomes insufficient when measuring the frequency, and thus, a spurious response is generated, thereby making it difficult to accurately measure the frequency.

The other problem is that, since the film deposition area is large, the temperature of the piezoelectric substrate becomes higher if film deposition is performed by sputtering, thereby encouraging the depolarization. In other words, the piezoelectric substrate may be depoled.

SUMMARY OF THE INVENTION

In order to overcome the problems described above, preferred embodiments of the present invention provide a method for manufacturing a piezoelectric resonator including very small vibration electrodes in which frequencies can be adjusted accurately without the need for a complicated positioning operation.

In addition, preferred embodiments of the present invention provide a method for manufacturing a piezoelectric resonator in which the accuracy of frequency measurements is increased by suppressing spurious responses during the measurements of frequencies, and also, the depolarization of a piezoelectric substrate can be prevented.

In order to achieve the above-described advantages, according to preferred embodiments of the present invention, a method for manufacturing a piezoelectric resonator in which vibrating electrodes are formed on both surfaces of a piezoelectric substrate such that they oppose each other and piezoelectric vibration is trapped between the vibrating electrodes includes the steps of forming a first electrode in an area including at least the vibrating electrode on each surface of the piezoelectric substrate so that the first electrode at least on one surface is formed partially on the surface of the piezoelectric substrate to trap the piezoelectric vibration, measuring the frequency of a resonator including the first electrode, determining the thickness of a metallic film required for a frequency adjustment based on the measured frequency, forming a second electrode made of the metallic film having the determined thickness in an area including at least the vibrating electrode on at least one surface of the piezoelectric substrate such that the second electrode is overlaid on the first electrode, and removing the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode.

In preferred embodiments of the present invention, instead of forming vibrating electrodes having a final configuration on a piezoelectric substrate in advance, the first electrodes are formed in an area wider than the resulting vibrating electrodes on the piezoelectric substrate. The first electrode at least on one surface is formed partially on the surface of the piezoelectric substrate to trap the piezoelectric vibration.

Then, the frequency, such as the resonant frequency or the anti-resonant frequency, or the phase, of the resonator including the first electrodes is measured. The thickness of a metallic film required for the frequency adjustment is determined based on the measured frequency or phase, and a second electrode made of the metallic film having the determined thickness is formed in an area including at least the vibrating electrode on the piezoelectric substrate. That is, the second electrode is overlaid on the first electrode. In this case, it is not necessary that the first electrode and the second electrode have the same configuration and that they are precisely positioned relative to each other as long as they are formed in an area wider than the resulting vibrating electrodes.

Then, by removing unnecessary portions of the first and second electrodes, the pattern of the vibrating electrodes is formed. The entire vibrating electrode patterned after forming the first and second electrodes is a laminated structure of the first and second electrodes. The vibrating electrode has a predetermined thickness. Additionally, there is no deviation between the first and second electrodes, unlike the case of the prior art shown in FIG. 13B. The patterning of the vibrating electrodes can be performed by a known process, for example, etching. In forming the pattern of the vibrating electrodes, instead of precisely positioning a metallic film onto a vibrating electrode which has been formed in advance, as is done conventionally, the pattern of the vibrating electrodes can be formed by removing unnecessary portions of the first and second electrodes formed in a large area, thereby making it possible to simply form the resulting vibrating electrodes with high precision. Since the unnecessary portions of the first and second electrodes overlaid on each other are removed, the resulting vibrating electrodes are free from thicker portions and thinner portions, i.e., the thickness of the vibrating electrodes is uniform, and the frequency can be adjusted to a target frequency.

It is not necessary that a second electrode is formed on each first electrode on both surfaces of the piezoelectric substrate, and the second electrode may be formed on the first electrode only on one surface of the piezoelectric substrate. In this case, the vibrating electrode on one surface is a laminated structure of the first and second electrodes, while the vibrating electrode on the other surface is formed of only the first electrode.

If the first electrodes both on the obverse and reverse surfaces entirely cover the surfaces of the piezoelectric substrate, a spurious response is generated, thereby making it difficult to perform the frequency adjustment accurately. In contrast, in preferred embodiments of the present invention, the first electrode at least on one surface is formed partially on the surface of the piezoelectric substrate to trap the piezoelectric vibration, and the frequency measurements can be performed accurately while suppressing spurious responses.

Since the first electrode at least on one surface of the piezoelectric substrate is formed only partially on the surface, an increase in the temperature of the piezoelectric substrate can be prevented when forming the first electrode by, for example, sputtering, thereby preventing deterioration in the characteristic caused by depolarization.

In preferred embodiments of the present invention, the frequency of the resonator including the first electrodes having a configuration different from that of the resulting vibrating electrodes is measured, and then, the thickness of a metallic film to be adjusted is determined based on the measured frequency. To implement this, it is necessary that there be a high correlation between the frequency of the resonator including the first electrodes and the frequency of the resonator including the resulting vibrating electrodes.

In the aforementioned method, the vibration mode used for measuring the frequency of the resonator including the first electrodes may be the same vibration mode used for the resonator including the resulting vibration electrodes. With this arrangement, the correlation between the frequencies of the resonators becomes high, thereby making it possible to perform the frequency adjustment accurately.

The vibration modes may preferably include the thickness-shear vibration mode, the thickness-longitudinal vibration mode, and other suitable modes.

In the aforementioned method, the first electrode may include a lower layer formed of a metallic film exhibiting high cohesion with the piezoelectric substrate and an upper layer laminated on the lower layer and formed of a metallic film exhibiting higher conductivity than the lower layer.

The lower layer of the first electrode has high cohesion with the piezoelectric substrate, thereby preventing the first electrode from separating from the piezoelectric substrate during the formation of the second electrode or during the pattern formation. The lower layer may be formed of a metallic layer, such as a Ni—Cu alloy layer.

Since the upper layer of the first electrode exhibits high conductivity, the good connection with an external circuit can be established when the first electrode is used as a terminal electrode. The upper layer may be formed of a metallic layer, such as an Ag layer. If the first electrode is connected to an external terminal by soldering, a metallic layer having high wettability is preferably used for the upper layer of the first electrode.

The second electrode may be formed of a metal of the same type as the upper layer of the first electrode. More specifically, a metallic layer exhibiting high conductivity is used for the upper layer of the first electrode, and a metallic layer also exhibiting high conductivity is formed on the upper layer of the first electrode. Thus, the cohesion between the first and second electrodes becomes higher, and as a result, an electrode structure having high strength can be formed.

The first electrode and the second electrode may have substantially the same configuration, in which case, the same sputtering mask can be used for the first and second electrodes, thereby reducing the manufacturing cost.

The second electrode may be formed to have a configuration in which the first electrode is reversed with respect to the surfaces of the piezoelectric substrate, and the first electrodes and the second electrodes cover substantially the entire surfaces of the piezoelectric substrate.

In this case, the same sputtering mask can be used. The formation of the first electrode partially on the surface of the piezoelectric substrate and the formation of electrodes in a large area of the piezoelectric substrate by forming the second electrodes can be performed at the same time. Accordingly, vibration trapping during the measurements of the frequency, the suppression of a temperature increase caused by sputtering, and the high flexibility to dispose electrodes can be achieved at the same time. That is, the electrodes other than the vibrating electrodes can be disposed at desired positions of the piezoelectric substrate.

According to preferred embodiments of the present invention, first electrodes are formed in an area in which piezoelectric vibration is trapped and which is wider than resulting vibrating electrodes on the surfaces of a piezoelectric substrate. The thickness of a metallic film required for the frequency adjustment is determined based on the frequency of the resonator including the first electrodes. Then, a second electrode formed of the metallic film having the determined thickness is formed in an area including at least the vibrating electrode. Subsequently, by removing unnecessary portions of the first and second electrodes, the pattern of the resulting vibrating electrodes is formed. Thus, it is not necessary that a metallic film used for the frequency adjustment be formed selectively only on the vibrating electrode, and instead, electrodes having thicknesses that are very precisely adjusted can be formed in the entire area in which the vibrating electrodes are formed. As a result, the accuracy of the frequency adjustment can be enhanced.

The first electrode at least on one surface is formed partially on the surface of the piezoelectric substrate to trap the piezoelectric vibration, and accordingly, the frequency measurements can be performed accurately while suppressing spurious responses. Additionally, an increase in the temperature of the piezoelectric substrate during the sputtering of the first electrodes can be prevented, thereby preventing deterioration in the characteristic caused by depolarization.

Other features, elements, steps, characteristics, and advantages of the present invention will become more apparent from the following description of preferred embodiments of the present invention with reference to the attached drawings.

DETAILED DESCRIPTION OF PREFERRED EMBODIMENTS

The present invention is described in detail below with reference to the accompanying drawings through illustration of preferred embodiments.

First Preferred Embodiment

A manufacturing process of a piezoelectric resonator according to a first preferred embodiment of the present invention is shown in FIGS. 1A through 4B. The piezoelectric resonator of this preferred embodiment is a bi-terminal resonator.

Figure 1A:
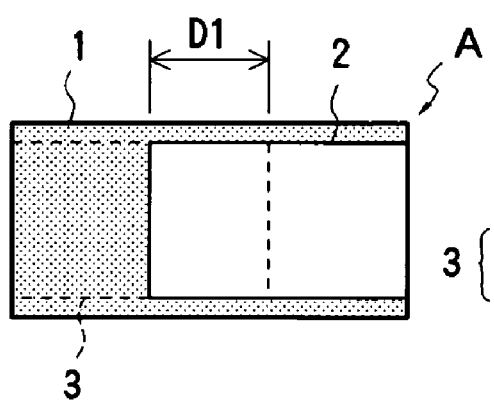
FIGS. 1A and 1B are a plan view and a side view, respectively, illustrating a resonator in the first stage of a manufacturing process according to a first preferred embodiment of the present invention.
Figure 1B:
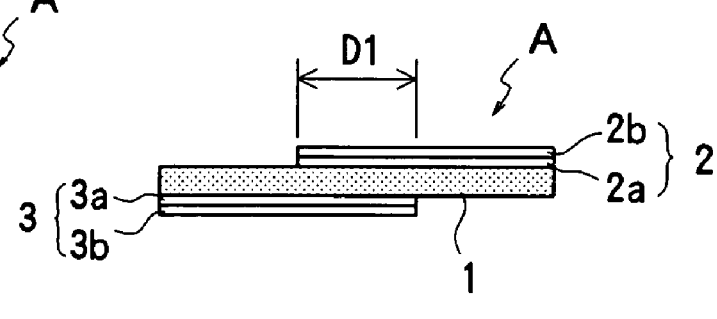

In FIGS. 1A and 1B, a resonator A in the first stage of the manufacturing process is shown. The resonator A includes a substantially rectangular piezoelectric substrate 1, and first electrodes 2 and 3 are respectively formed on the obverse and reverse surfaces of the piezoelectric substrate 1. The resonator A is preferably an energy-trap thickness-shear vibration mode resonator, and polarization has been performed on the obverse and reverse surfaces of the piezoelectric substrate 1 in the parallel direction. One end of the first electrode 2 and one end of the first electrode 3 oppose each other at an approximately central portion of the piezoelectric substrate 1, and the other ends thereof are led out to different terminals. An opposing portion D1 of the first electrodes 2 and 3 has an area larger than a resulting vibrating electrode. The trapped vibration of the thickness-shear vibration mode is excited in the opposing portion D1. The first electrodes 2 and 3 preferably have a double-layered structure including an upper layer 2b and a lower layer 2a and an upper layer 3b and a lower layer 3a, respectively. The lower layers 2a and 3a are each preferably formed of a metallic layer exhibiting high cohesion with the piezoelectric substrate 1, for example, a Ni—Cu alloy layer, while the upper layers 2b and 3b are each preferably formed of a metallic layer exhibiting high conductivity and wettability, for example, an Ag layer. Those metallic layers are formed by a dry process, such as sputtering or vapor deposition or by a wet process, such as plating.

Although in this preferred embodiment the first electrodes 2 and 3 are preferably formed as strip-like partial electrodes, they may be formed in another configuration as long as it is disposed in an area including the vibrating electrodes. Accordingly, one of the first electrodes 2 and 3 may be formed on the entire surface of the piezoelectric substrate 1.

Figure 2:
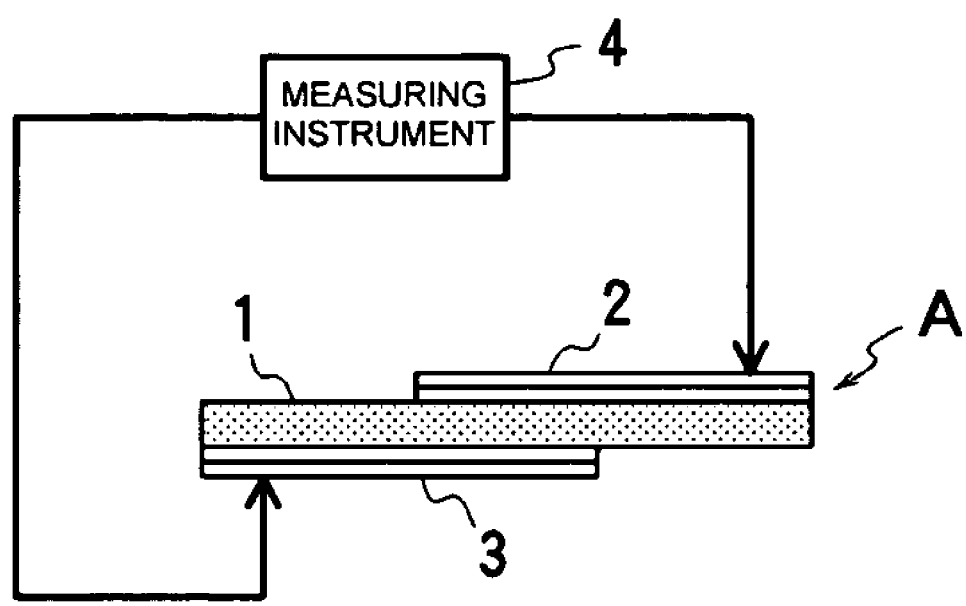
FIG. 2 illustrates a method for measuring the resonant frequency of the resonator shown in FIGS. 1A and 1B.

FIG. 2 illustrates a step of measuring the resonant frequency $fr_1$ of the resonator A in the first stage by connecting a measuring instrument 4 to the first electrodes 2 and 3 on the obverse and reverse surfaces of the resonator A. Instead of the resonant frequency f, another resonance characteristic, such as the anti-resonant frequency fa or the phase, may be measured.

Figure 3A:
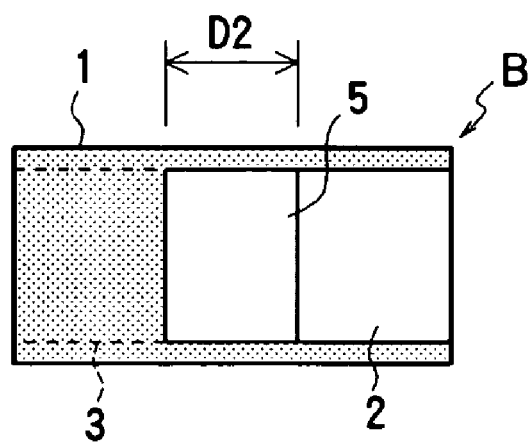
FIGS. 3A and 3B are a plan view and a side view, respectively, illustrating a resonator in the second stage obtained by forming second electrodes on the resonator shown in FIGS. 1A and 1B.
Figure 3B:
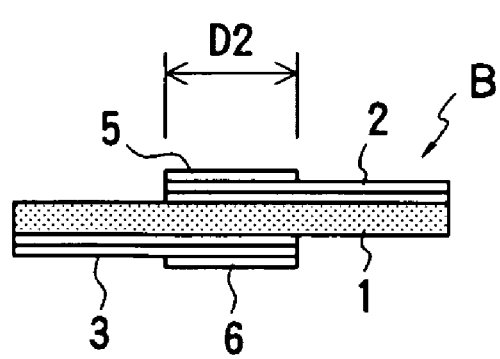

FIGS. 3A and 3B illustrate a resonator B in the second stage of the manufacturing process. In the resonator B, second electrodes 5 and 6 formed of a metallic film are respectively formed on the first electrodes 2 and 3 of the resonator A in the first stage in an area D2 which is wider than the resulting vibrating electrode. The second electrodes 5 and 6 are formed by a dry process, such as sputtering or vapor deposition. Sputtering is more preferable since it can easily control the thickness of the film. The thickness of the second electrodes 5 and 6 are determined based on the resonant frequency $fr_1$ measured as shown in FIG. 2. The thickness of the second electrodes 5 and 6 can be determined by using the following relational expression by way of example:

[Resonant frequency of the resonator A]−[resonant frequency of the resonator C]=α×[the thickness of the second electrodes]+β where α and β represent different constants depending on the piezoelectric material, the electrode configuration, etc.

In FIGS. 3A and 3B, the area D2 in which the second electrodes 5 and 6 are formed is substantially the same as the opposing portion D1 of the first electrodes 2 and 3. However, the area D2 may be wider or narrower than the opposing portion D1 as long as it is wider than the resulting vibrating electrode. Additionally, the second electrodes 5 and 6 may be the same configuration as that of the first electrodes 2 and 3, in which case, the same sputtering mask can be formed both for the first electrodes 2 and 3 and the second electrodes 5 and 6.

In this preferred embodiment, the second electrodes 5 and 6 preferably have a single layer structure, and preferably, they are formed of the same type of metal (for example, Ag) as that of the upper layers 2b and 3b of the first electrodes 2 and 3.

Figure 13A:
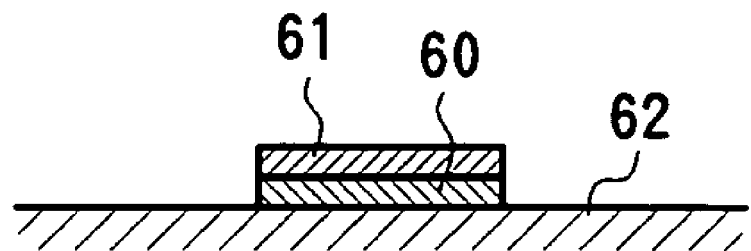
FIGS. 13A and 13B are sectional views illustrating the conditions in which a metallic thin film is formed on a vibrating electrode according to a known method.
Figure 13B:
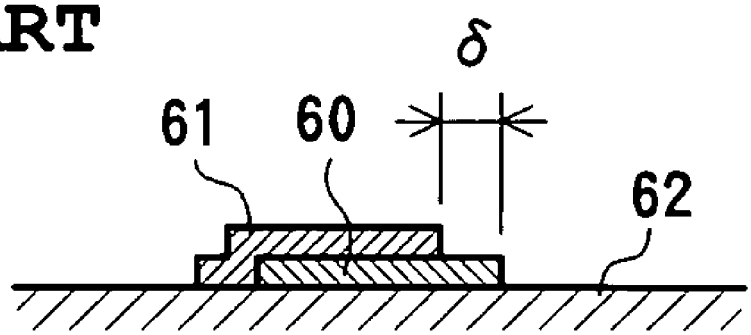

In FIGS. 3A and 3B, one end of each of the first electrodes 2 and 3 is flush with one end of each of the second electrodes 5 and 6, respectively. Generally, however, there is a deviation between the first electrodes and the second electrodes, as shown in FIG. 13B. When the first electrodes 2 and 3 are a multi-layered structure, as shown in FIGS. 1A and 1B, no deviation occurs since the first electrodes 2 and 3 and the second electrodes 5 and 6 are formed by one masking operation.

Figure 4A:
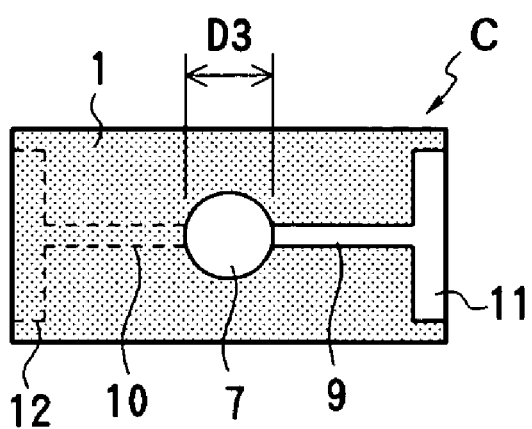
FIGS. 4A and 4B are a plan view and a side view, respectively, illustrating a resonator in the third stage obtained by forming a pattern in the resonator shown in FIGS. 3A and 3B.
Figure 4B:
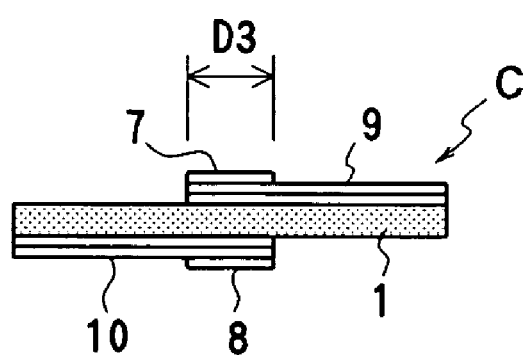

FIGS. 4A and 4B illustrate a resonator C in the third stage, i.e., the final stage. In the resonator C, a pattern of vibrating electrodes 7 and 8 is formed by removing unnecessary portions of the first electrodes 2 and 3 and the second electrodes 5 and 6 of the resonator B in the second stage by a known process, for example, etching. In this case, the overall vibrating electrodes 7 and 8 preferably have a laminated structure of the first and second electrodes. Simultaneously with the formation of the vibrating electrodes 7 and 8, terminal electrodes 11 and 12 connected to the vibrating electrodes 7 and 8 with narrow lead-out electrodes 9 and 10, respectively, therebetween are formed at the edges of the obverse and reverse surfaces of the piezoelectric substrate 1. An area D3 in which the vibrating electrodes 7 and 8 are formed is included in the area D1 of the first stage and the area D2 of the second stage.

The thickness of the vibrating electrodes 7 and 8 of the resonator C is equal to the thickness of the laminated structure of the first electrode 2 and the second electrode 5 or the first electrode 3 and the second electrode 6, respectively. The resonant frequency $fr_2$ of the resonator C has been adjusted close to a target frequency by the additional thickness of the second electrodes 5 and 6 formed in the second stage.

In the pattern formation of the vibrating electrodes 7 and 8, instead of accurately positioning a metallic thin film onto a vibrating electrode which has been formed in advance, as is conventionally done, the pattern of the vibrating electrodes 7 and 8 is formed by removing unnecessary portions of the first electrodes 2 and 3 and the second electrodes 5 and 6 formed in wide areas. As a result, the vibrating electrodes 7 and 8 can be easily formed with high precision. Additionally, the vibrating electrodes 7 and 8 are free from thicker portions and thinner portions, i.e., the thickness of the vibrating electrodes 7 and 8 is uniform, thereby making it possible to adjust the frequency to a target frequency with high accuracy.

Second Preferred Embodiment

Figure 5A:
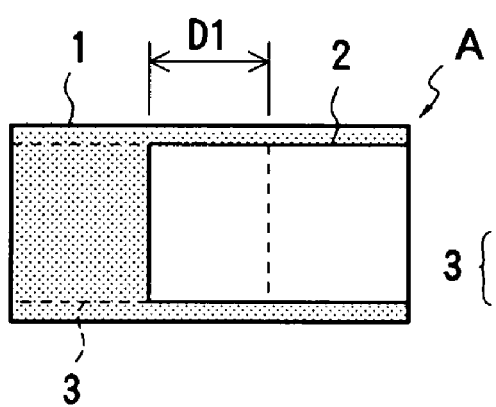
FIGS. 5A and 5B are a plan view and a side view, respectively, illustrating a resonator in the first stage of a manufacturing process according to a second preferred embodiment of the present invention.
Figure 5B:
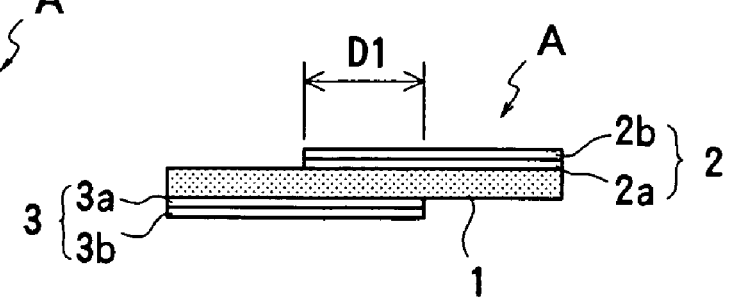
Figure 6:
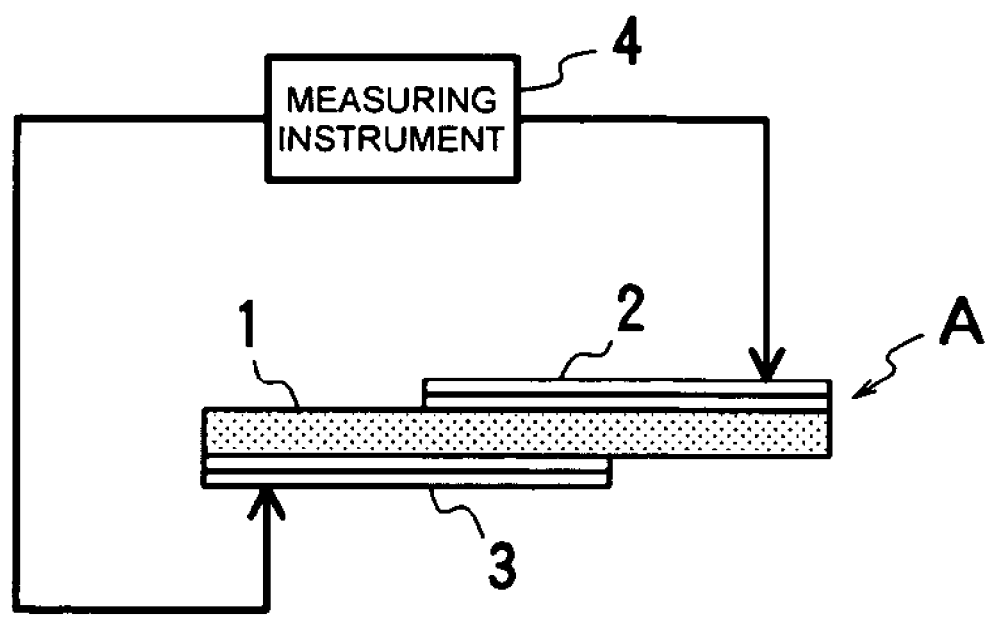
FIG. 6 illustrates a method for measuring the resonant frequency of the resonator shown in FIGS. 5A and 5B.

A manufacturing process of a piezoelectric resonator according to a second preferred embodiment of the present invention is shown in FIGS. 5A through 8C. The piezoelectric substrate of this preferred embodiment is preferably a tri-terminal filter. FIGS. 5A, 5B, and 6 are similar to FIGS. 1A, 1B, and 2, respectively, and elements in FIGS. 5A, 5B, and 6 similar to those in FIGS. 1A, 1B, and 2 are indicated by like reference numerals, and an explanation thereof is thus omitted.

Figure 7A:
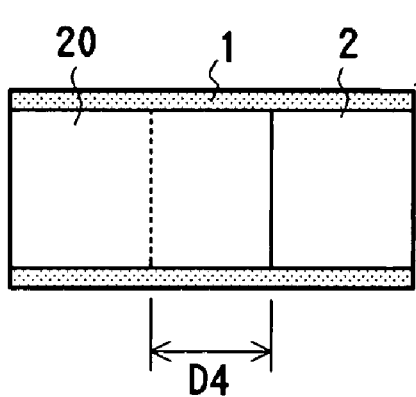
FIGS. 7A and 7B are a plan view and a side view, respectively, illustrating a resonator in the second stage obtained by forming second electrodes on the resonator shown in FIGS. 5A and 5B.
Figure 7B:
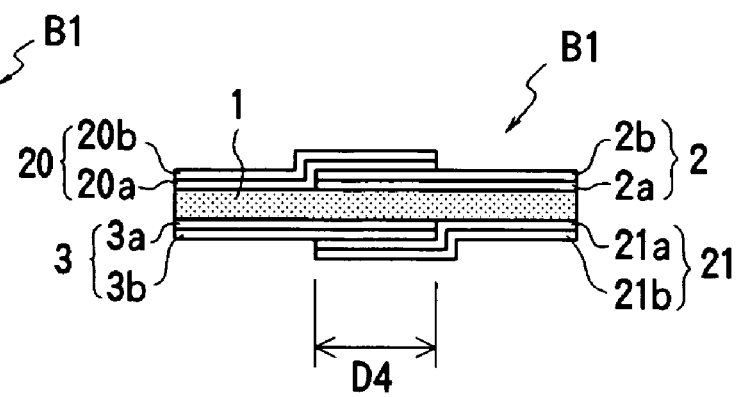

FIGS. 7A and 7B illustrate a resonator B1 in the second stage. On the obverse surface of the resonator B1, a second electrode 20 is formed from the opposing portion D1 of the resonator A of the first stage to the end of the piezoelectric substrate 1 opposite to the side on which the first electrode 2 is disposed. On the reverse surface of the resonator B1, a second electrode 21 is formed from the opposing portion D1 of the resonator A of the first stage to the end of the piezoelectric substrate 1 opposite to the side on which the first electrode 3 is disposed. That is, the entire obverse surface of the resonator B1 is substantially covered with the first electrode 2 and the second electrode 20, while the entire reverse surface of the resonator B1 is substantially covered with the first electrode 3 and the second electrode 21. The second electrodes 20 and 21 are also preferably formed of a metallic thin film by a dry process, such as sputtering or vapor deposition. As in the first electrodes 2 and 3, the second electrodes 20 and 21 of this preferred embodiment are preferably a double-layered structure respectively formed of upper layers 20b and 21b, such as Ag layers, and lower layers 20a and 21a, such as Ni—Cu alloy layers.

The thickness of the second electrodes 20 and 21 is determined by the resonant frequency $fr_1$ measured as shown in FIG. 6. In this preferred embodiment, the second electrodes 20 and 21 have a configuration obtained by reversing (upside down) the first electrodes 2 and 3, respectively. That is, the sputtering mask used for forming the first electrodes 2 and 3 can be used for forming the second electrodes 20 and 21 by reversing the mask.

In FIGS. 7A and 7B, an overlapping portion D4 between the second electrode 20 and the first electrode 2 or between the second electrode 21 and the first electrode 3 is equal to the opposing portion D1 of the first electrodes 2 and 3 (FIGS. 5A and 5B). However, the overlapping portion D4 may be wider or narrower than the opposing portion D1 as long as it is wider than an area D5 in which the resulting vibrating electrodes are formed.

Figure 8A:
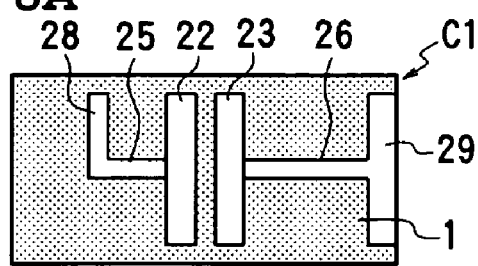
FIGS. 8A, 8B, and 8C are a plan view, a bottom view, and a side view, respectively, illustrating a resonator in the third stage obtained by forming a pattern in the resonator shown in FIGS. 7A and 7B.
Figure 8B:
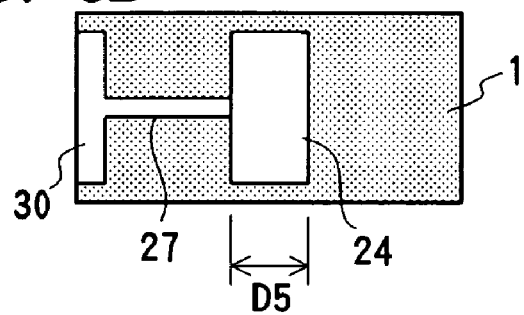
Figure 8C:
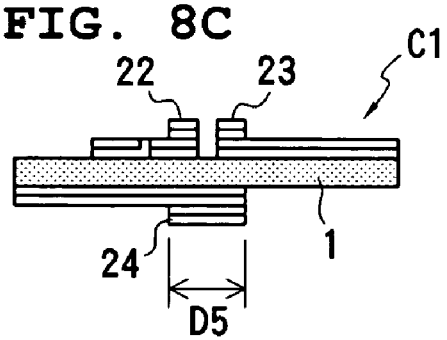

FIGS. 8A, 8B, and 8C illustrate a resonator C1 in the third stage, i.e., the final stage. The resonator 1C is obtained by forming the patterns of vibrating electrodes 22, 23, and 24 by removing unnecessary portions of the first electrodes 2 and 3 and the second electrodes 20 and 21 of the resonator B1 in the second stage by a known process, for example, etching. The vibrating electrodes 22 and 23 on the obverse surface of the piezoelectric substrate 1 are narrow electrodes formed by generating very small gaps, while the vibrating electrode 24 on the reverse surface of the piezoelectric substrate 1 is a wide electrode facing the vibrating electrodes 22 and 23. The area D5 in which the vibrating electrodes 22, 23, and 24 are formed is smaller than the opposing portion D1 and the overlapping portion D4 in the first and second stages, respectively. Simultaneously with the formation of the vibrating electrodes 22, 23, and 24, terminal electrodes 28 and 29 connected to the vibrating electrodes 22 and 23 with narrow lead-out electrodes 25 and 26, respectively, therebetween are formed on the obverse surface of the piezoelectric substrate 1, and a terminal electrode 30 connected to the vibrating electrode 24 with a narrow lead-out electrode 27 therebetween is formed on the reverse surface of the piezoelectric substrate 1.

By using the terminal electrodes 28 and 29 as input/output terminals and the terminal electrode 30 as a ground terminal, the resonator C1 can be used as a filter.

The thickness of the vibrating electrodes 22, 23, and 24 of the resonator C1 is preferably the same as that of the laminated structure of the first electrode 2 and the second electrode 20 or of the first electrode 3 and the second electrode 21 of the resonator B1. The resonant frequency $fr_3$ of the resonator C1 is adjusted close to a target frequency by the additional thickness of the second electrodes 20 and 21 formed in the second stage.

In this preferred embodiment, there is no similarity in the configuration between the resonator A in the first stage and the resonator C1 in the final stage. However, both the resonators A and C1 utilize the energy-trap thickness-shear vibration mode, and there is a high correlation in the resonant frequency between the resonator A and the resonator C1, and thus, the thickness of the second electrodes 20 and 21 can be determined based on the resonant frequency $fr_1$ of the resonator A. The frequency can be adjusted to the target frequency with high accuracy by forming the second electrodes 20 and 21 made of a metallic thin film in the resonator A in the first stage while controlling the thickness thereof.

Third Preferred Embodiment

A manufacturing process of a piezoelectric resonator according to a third preferred embodiment of the present invention is shown in FIGS. 9A through 12C. The piezoelectric resonator is preferably a two-stage double-mode filter obtained by forming two tri-terminal filters on a single piezoelectric substrate.

Figure 9A:
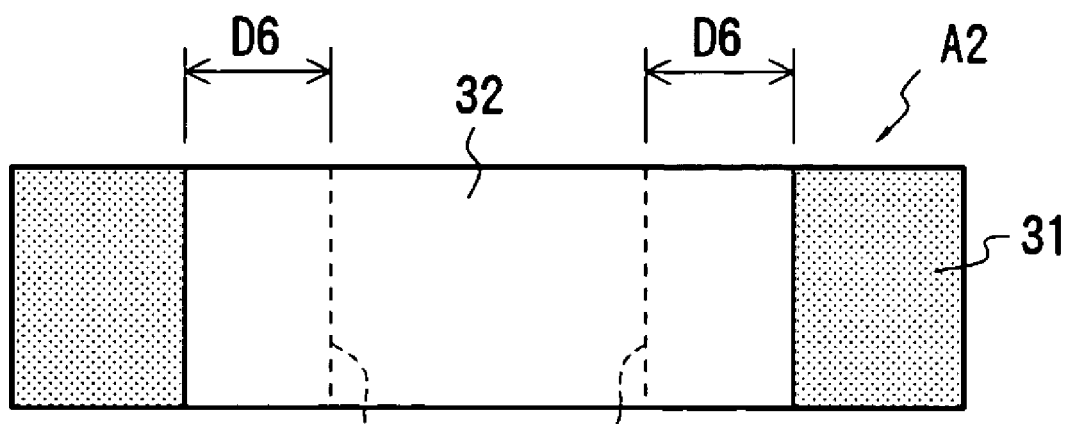
FIGS. 9A and 9B are a plan view and a side view, respectively, illustrating a resonator in the first stage of a manufacturing process according to a third preferred embodiment of the present invention.
Figure 9B:
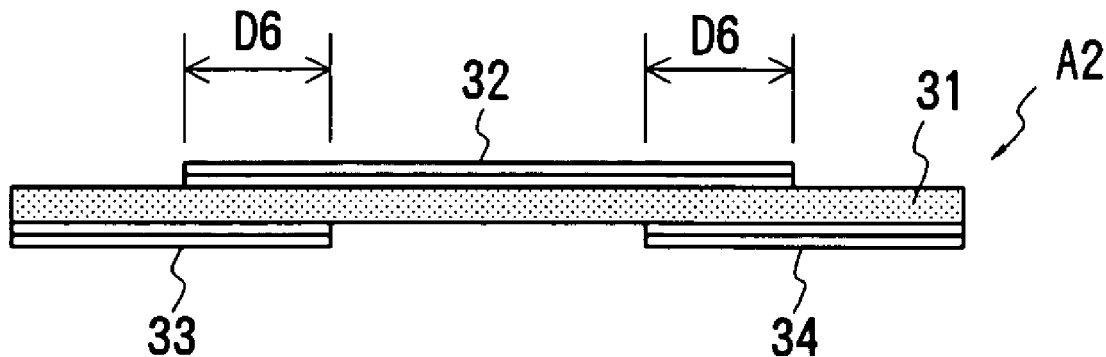

FIGS. 9A and 9B illustrate a resonator A2 in the first stage. The resonator A2 includes a substantially rectangular piezoelectric substrate 31, and polarization has been performed on the obverse and reverse surfaces of the piezoelectric substrate 1 in the parallel direction. A first electrode 32 is formed at an approximately central portion of the obverse surface of the piezoelectric substrate 31, while first electrodes 33 and 34 are formed at two ends of the reverse surface of the piezoelectric substrate 31. The first electrode 32 on the obverse surface opposes the first electrodes 33 and 34 on the reverse surface at the two portions of the piezoelectric substrate 31. An opposing portion D6 between the first electrode 32 and the second electrode 33 or 34 is larger than the resulting vibrating electrodes, and trapped vibration in the thickness-shear vibration mode is excited in the opposing portions D6. As in the first and second preferred embodiments, the first electrodes 32, 33, and 34 are also a double-layered structure, and are formed by a dry process, such as sputtering or vapor deposition.

Figure 10:
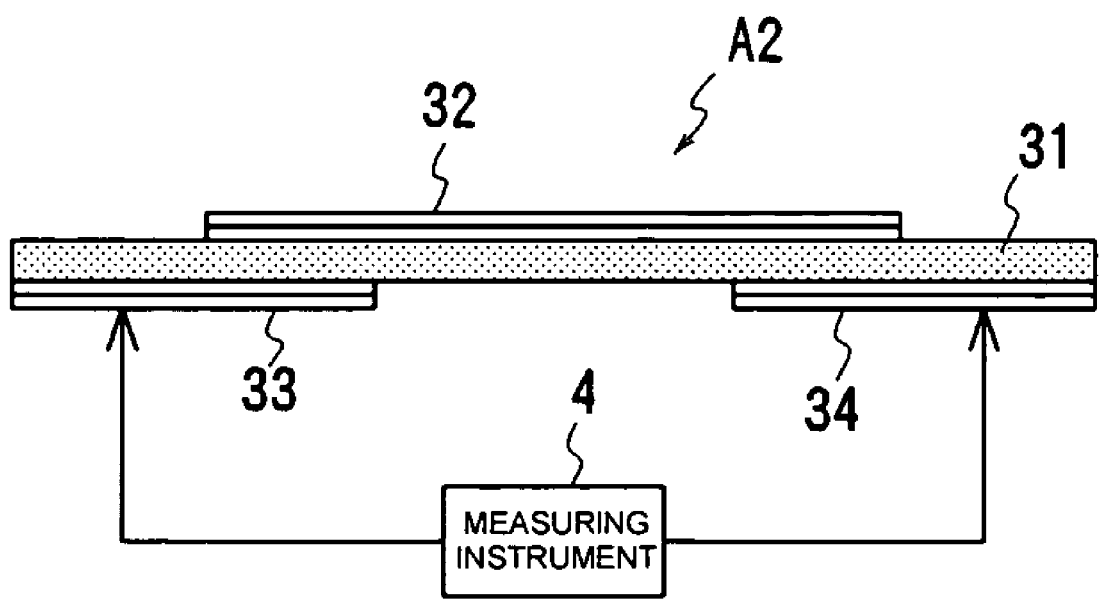
FIG. 10 illustrates a method for measuring the resonant frequency of the resonator shown in FIGS. 9A and 9B.

FIG. 10 illustrates a step of measuring the resonant frequency of the resonator A2 by connecting the measuring instrument 4 between the first electrodes 33 and 34.

Figure 11:
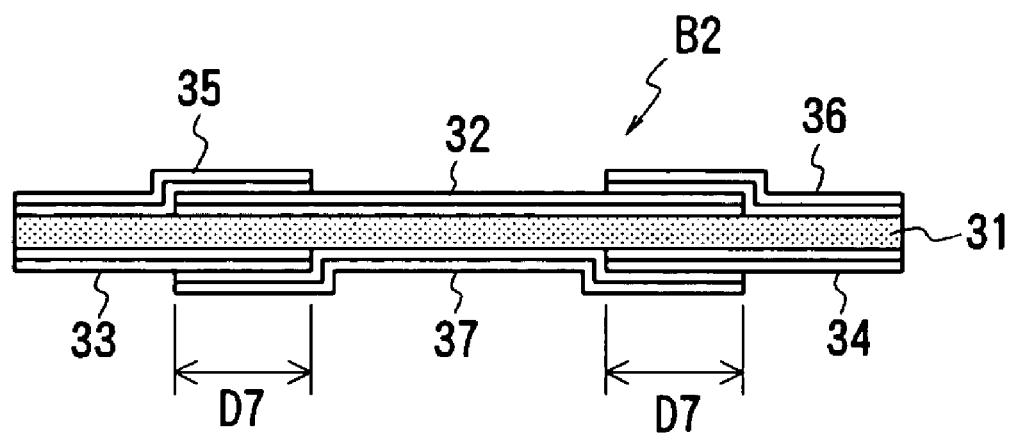
FIG. 11 is a side view illustrating a resonator in the second stage obtained by forming second electrodes on the resonator shown in FIGS. 9A and 9B.

FIG. 11 illustrates a resonator B2 in the second stage. In the resonator B2, second electrodes 35 and 36 having a configuration obtained by reversing (upside down) the first electrodes 33 and 34 are formed on the obverse surface of the resonator A2, while a second electrode 37 having a configuration obtained by reversing the first electrode 32 is formed on the reverse surface of the resonator A2. Accordingly, the entire obverse and reverse surfaces of the resonator B2 are substantially covered with the first and second electrodes. As in the first electrodes 32, 33, and 34, the second electrodes 35, 36, and 37 are formed by a dry process, such as sputtering or vapor deposition. In this preferred embodiment, the second electrodes 35, 36, and 37 preferably have a double-layered structure, but they may have a single layer structure.

The thickness of the second electrodes 35, 36, and 37 is determined based on the resonant frequency measured as shown in FIG. 10. As stated above, since the second electrodes 35, 36, and 37 are reversed (upside down) from the first electrodes 33, 34, and 32, the sputtering mask used for forming the first electrodes 32, 33, and 34 can be used for forming the second electrodes 37, 35, and 36 by reversing the mask.

In FIG. 11, an overlapping portion D7 between the first electrode 32 and the second electrode 35 or 36, or between the second electrode 37 and the first electrode 33 or 34 is equal to the opposing portion D6. However, the overlapping portion D7 may be wider or narrow than the opposing portion D6 as long as it is wider than an area D8 in which the resulting vibrating electrodes are formed.

Figure 12A:
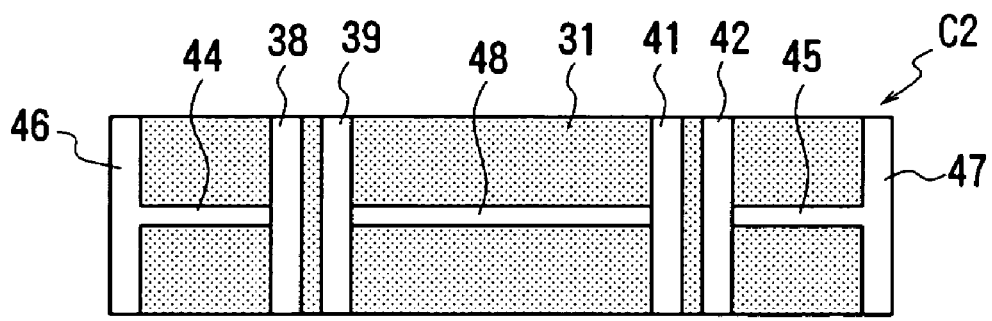
FIGS. 12A, 12B, and 12C are a plan view, a bottom view, and a side view, respectively, illustrating a resonator in the third stage obtained by forming patterns in the resonator shown in FIG. 11.
Figure 12B:
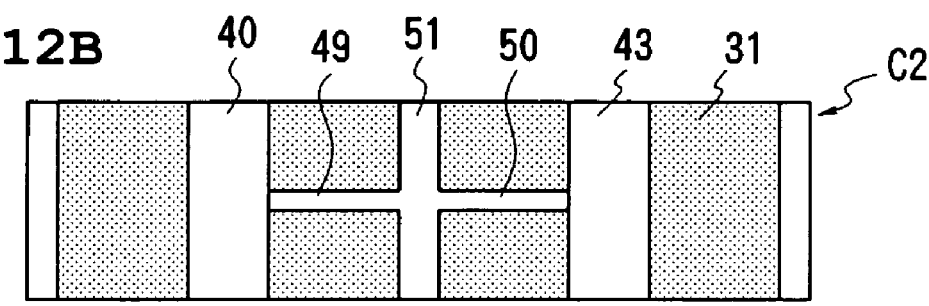
Figure 12C:
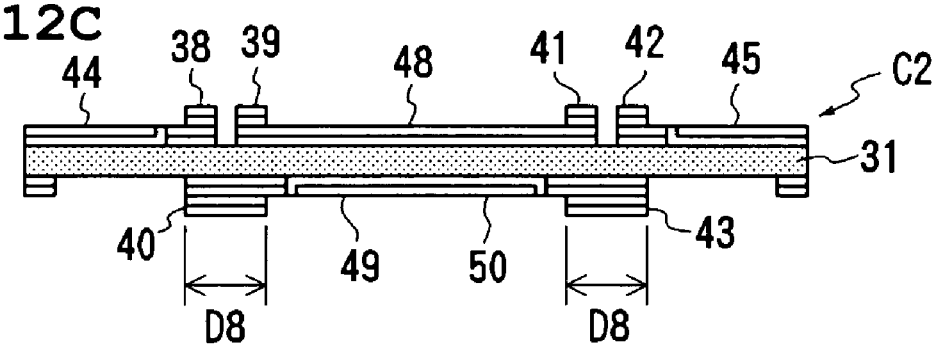

FIGS. 12A, 12B, and 12C illustrate a resonator C2 in the third stage, i.e., the final stage. The resonator C2 is obtained by forming the patterns of vibrating electrodes 38, 39, and 40, and 41, 42, and 43 by removing unnecessary portions of the first electrodes 32, 33, and 34 and the second electrodes 35, 36, and 37 of the resonator B2 in the second stage by a known process, such as etching. The vibrating electrodes 38, 39, 41, and 42 on the obverse surface of the piezoelectric substrate 31 are narrow electrodes formed by generating small gaps, while the vibrating electrodes 40 and 43 on the reverse surface are wide electrodes opposing the vibrating electrodes 38 and 39 and the vibrating electrodes 41 and 42, respectively. The area D8 in which the vibrating electrodes 38, 39, and 40 or the vibrating electrodes 41, 42, and 43 are formed is smaller than the opposing portion D6 in the first stage or the overlapping portion D7 in the second stage. Simultaneously with the formation of the vibrating electrodes 38 through 43, terminal electrodes 46 and 47 connected to the vibrating electrodes 38 and 42 with narrow lead-out electrodes 44 and 45, respectively, therebetween are formed at two ends of the obverse surface of the piezoelectric substrate 31, and a narrow connecting electrode 48 for connecting the vibrating electrodes 39 and 41 is formed at the central portion of the obverse surface of the piezoelectric substrate 31. Additionally, a terminal electrode 51 connected to the vibrating electrodes 40 and 43 with lead-out electrodes 49 and 50, respectively, therebetween is formed at the approximately central portion of the reverse surface of the piezoelectric substrate 31. By using the terminal electrodes 46 and 47 as input/output terminals and the terminal electrode 51 as a ground terminal, the resonator C2 can be used as a two-stage double-mode filter.

The thickness of the vibrating electrodes 38 through 43 of the resonator C2 is equal to the thickness of the laminated structure of the first electrode 32 and the second electrode 35 or 36 or the first electrode 33 or 34 and the second electrode 37 of the resonator B2. The resonant frequency of the resonator C2 can be adjusted close to a target frequency by the additional thickness of the second electrodes 35, 36, and 37.

The manufacturing method for one piezoelectric resonator has been described above. In an actual manufacturing process, however, on a motherboard in which a plurality of piezoelectric substrates are connected to each other, first electrodes are formed, the frequency fr is measured, second electrodes are formed, and then, the pattern formation is performed.

Then, the motherboard is cut into individual devices. The measurement of the frequency fr of each device may further be performed.

Additionally, although the above-described manufacturing process has been discussed in the context of the thickness-shear vibration mode resonator, it may be used for a thickness-longitudinal vibration mode resonator and other suitable types of resonators.

In the above description, electrodes having a two double (upper and lower)-layered structure are preferably formed as first electrodes. However, the first electrodes may have a single layer structure or a multi (three or more)-layered structure. Similarly, the second electrodes may also have a single layer or a multi (three or more)-layered structure.

Although in the first through third preferred embodiments, a second electrode is formed on each first electrode on both the surfaces of the piezoelectric substrate, the second electrode may be formed on the first electrode, only on one surface of the piezoelectric substrate. In this case, the vibrating electrode on one surface is a laminated structure of the first and second electrodes, while the vibrating electrode on the other surface is formed of only the first electrode.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a piezoelectric resonator in which vibrating electrodes are formed on both surfaces of a piezoelectric substrate such that the vibrating electrodes oppose each other and piezoelectric vibration is trapped between the vibrating electrodes, the method comprising the steps of:
    forming a first electrode in an area including at least the vibrating electrode on each surface of the piezoelectric substrate so that the first electrode at least on one surface is formed partially on the surface of the piezoelectric substrate to trap the piezoelectric vibration;
    measuring a frequency of a resonator including the first electrode;
    determining a thickness of a metallic film required for a frequency adjustment based on the measured frequency;
    forming a second electrode made of the metallic film having the determined thickness in an area including at least the vibrating electrode on at least one surface of the piezoelectric substrate such that the second electrode is overlaid on the first electrode; and
    removing portions of the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode; wherein
    in the step of forming the first electrode, the first electrode is formed such that the resonator is arranged to vibrate in a vibration mode in the step of measuring the frequency of the resonator including the first electrode; and
    in the step of removing the portions of the first electrode and the second electrode, the portions are removed such that the resonator is arranged to vibrate in the same vibration mode in which the resonator is arranged to vibrate in the step of measuring the frequency of the resonator.

2. The method according to claim 1, wherein the first electrode and the second electrode have substantially the same configuration.

3. The method according to claim 1, wherein the second electrode is formed by reversing the first electrode with respect to the surfaces of the piezoelectric substrate, and the first electrode and the second electrode cover substantially the entire surfaces of the piezoelectric substrate.

4. The method according to claim 1, wherein the step of measuring a frequency of a resonator includes the step of measuring a resonant frequency of the resonator.

5. The method according to claim 1, wherein the step of measuring a frequency of a resonator includes the step of measuring an anti-resonant frequency of the resonator.

6. The method according to claim 1, wherein the first electrode and the second electrode have a single-layered structure.

7. The method according to claim 1, wherein the first electrode and the second electrode have a strip-shaped configuration.

8. The method according to claim 1, wherein the first electrode and the second electrode are formed by sputtering or vapor deposition.

9. A method for manufacturing a piezoelectric resonator in which vibrating electrodes are formed on both surfaces of a piezoelectric substrate such that the vibrating electrodes oppose each other and piezoelectric vibration is trapped between the vibrating electrodes, the method comprising the steps of:
    forming a first electrode in an area including at least the vibrating electrode on each surface of the piezoelectric substrate so that the first electrode at least on one surface is formed partially on the surface of the piezoelectric substrate to trap the piezoelectric vibration;
    measuring a frequency of a resonator including the first electrode; determining a thickness of a metallic film required for a frequency adjustment based on the measured frequency;
    forming a second electrode made of the metallic film having the determined thickness in an area including at least the vibrating electrode on at least one surface of the piezoelectric substrate such that the second electrode is overlaid on the first electrode; and
    removing portion of the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode; wherein
    the first electrode includes a lower layer formed of a metallic film exhibiting high cohesion with the piezoelectric substrate and an upper layer laminated on the lower layer and formed of a metallic film exhibiting higher conductivity than the lower layer.

10. The method according to claim 9, wherein the second electrode is formed of a metal of the same type as the upper layer of the first electrode.

11. A method for manufacturing a piezoelectric resonator in which vibrating electrodes are formed on both surfaces of a piezoelectric substrate such that the vibrating electrodes oppose each other and piezoelectric vibration is trapped between the vibrating electrodes, the method comprising the steps of:
    forming a first electrode in an area including at least the vibrating electrode on each surface of the piezoelectric substrate so that the first electrode at least on one surface is formed partially on the surface of the piezoelectric substrate to trap the piezoelectric vibration;

measuring a frequency of a resonator including the first electrode;

determining a thickness of a metallic film required for a frequency adjustment based on the measured frequency;

forming a second electrode made of the metallic film having the determined thickness in an area including at least the vibrating electrode on at least one surface of the piezoelectric substrate such that the second electrode is overlaid on the first electrode; and removing portions of the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode; wherein the resonator is one of a thickness-shear vibration mode resonator and a thickness-longitudinal vibration mode resonator.

12. A method for manufacturing a piezoelectric resonator in which vibrating electrodes are formed on both surfaces of a piezoelectric substrate such that the vibrating electrodes oppose each other and piezoelectric vibration is trapped between the vibrating electrodes, the method comprising the steps of:

forming a first electrode in an area including at least the vibrating electrode on each surface of the piezoelectric substrate so that the first electrode at least on one surface is formed partially on the surface of the piezoelectric substrate to trap the piezoelectric vibration;

measuring a frequency of a resonator including the first electrode;

determining a thickness of a metallic film required for a frequency adjustment based on the measured frequency;

forming a second electrode made of the metallic film having the determined thickness in an area including at least the vibrating electrode on at least one surface of the piezoelectric substrate such that the second electrode is overlaid on the first electrode; and removing portions of the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode; wherein the first electrode and the second electrode have a double-layered structure.

13. A method for manufacturing a piezoelectric resonator in which vibrating electrodes are formed on both surfaces of a piezoelectric substrate such that the vibrating electrodes oppose each other and piezoelectric vibration is trapped between the vibrating electrodes, the method comprising the steps of:

forming a first electrode in an area including at least the vibrating electrode on each surface of the piezoelectric substrate so that the first electrode at least on one surface is formed partially on the surface of the piezoelectric substrate to trap the piezoelectric vibration;

measuring a frequency of a resonator including the first electrode; determining a thickness of a metallic film required for a frequency adjustment based on the measured frequency;

forming a second electrode made of the metallic film having the determined thickness in an area including at least the vibrating electrode on at least one surface of the piezoelectric substrate such that the second electrode is overlaid on the first electrode; and removing portions of the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode; wherein the resonator is a bi-terminal resonator.

14. A method for manufacturing a piezoelectric resonator in which vibrating electrodes are formed on both surfaces of a piezoelectric substrate such that the vibrating electrodes oppose each other and piezoelectric vibration is trapped between the vibrating electrodes, the method comprising the steps of:

forming a first electrode in an area including at least the vibrating electrode on each surface of the piezoelectric substrate so that the first electrode at least on one surface is formed partially on the surface of the piezoelectric substrate to trap the piezoelectric vibration;

measuring a frequency of a resonator including the first electrode;

determining a thickness of a metallic film required for a frequency adjustment based on the measured frequency;

forming a second electrode made of the metallic film having the determined thickness in an area including at least the vibrating electrode on at least one surface of the piezoelectric substrate such that the second electrode is overlaid on the first electrode; and removing portions of the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode; wherein the resonator is a tri-terminal resonator.

15. A method for manufacturing a piezoelectric resonator in which vibrating electrodes are formed on both surfaces of a piezoelectric substrate such that the vibrating electrodes oppose each other and piezoelectric vibration is trapped between the vibrating electrodes, the method comprising the steps of:

forming a first electrode in an area including at least the vibrating electrode on each surface of the piezoelectric substrate so that the first electrode at least on one surface is formed partially on the surface of the piezoelectric substrate to trap the piezoelectric vibration;

measuring a frequency of a resonator including the first electrode;

determining a thickness of a metallic film required for a frequency adjustment based on the measured frequency;

forming a second electrode made of the metallic film having the determined thickness in an area including at least the vibrating electrode on at least one surface of the piezoelectric substrate such that the second electrode is overlaid on the first electrode; and removing portions of the first electrode and the second electrode such that the vibrating electrodes on both the surfaces of the piezoelectric substrate oppose each other so that the entire vibrating electrode on the surface of the piezoelectric substrate on which the second electrode is formed becomes a laminated structure of the first electrode and the second electrode; wherein the resonator is a two-stage double-mode filter including two tri-terminal filters formed on the piezoelectric substrate.

* * * * *